United States Patent [19]

Rasor

[11] Patent Number: 5,848,355
[45] Date of Patent: Dec. 8, 1998

[54] FREQUENCY SYNTHESIZER CORRECTION USING A TEMPERATURE RESPONSIVE DIVISOR CONTROL

[75] Inventor: Gregg Edward Rasor, Boynton Beach, Fla.

[73] Assignee: Motorola, Inc., Schaumburg, Ill.

[21] Appl. No.: 457,188

[22] Filed: Jun. 1, 1995

Related U.S. Application Data

[63] Continuation of Ser. No. 87,246, Jul. 7, 1993, abandoned.

[51] Int. Cl.$^6$ ....................................................... H04B 1/16
[52] U.S. Cl. ............................ 455/260; 455/310; 331/176
[58] Field of Search ................................. 331/16, 66, 14, 331/175, 176; 340/825.44; 307/651; 310/315, 358; 455/76, 183.1, 183.2, 256, 258–260, 257, 182.1, 182.2, 192.1, 192.2, 265, 296, 310

[56] References Cited

U.S. PATENT DOCUMENTS

| | | | |
|---|---|---|---|
| 3,821,665 | 6/1974 | Irwin et al. ................................. | 331/66 |
| 4,380,745 | 4/1983 | Barlow .................................... | 331/176 |
| 4,384,229 | 5/1983 | Inoue et al. ............................. | 310/358 |
| 4,454,483 | 6/1984 | Baylor ..................................... | 331/176 |
| 4,816,774 | 3/1989 | Martin ...................................... | 331/16 |
| 4,906,944 | 3/1990 | Frerking .................................. | 331/176 |
| 4,910,473 | 3/1990 | Niwa ........................................ | 331/66 |
| 5,081,431 | 1/1992 | Kubo et al. ............................. | 331/176 |
| 5,107,259 | 4/1992 | Weitzen et al. ..................... | 360/825.44 |
| 5,170,136 | 12/1992 | Yamakawa et al. .................... | 331/176 |
| 5,172,075 | 12/1992 | Yerburg et al. .......................... | 331/176 |
| 5,604,468 | 2/1997 | Gillig ..................................... | 455/260 |

FOREIGN PATENT DOCUMENTS

| | | | |
|---|---|---|---|
| 0025427 | 2/1984 | Japan .................................... | 331/176 |

OTHER PUBLICATIONS

Bechmann, *Higher–Order Temperature Coefficients of the Elastic Stiffness and Compliances of Alpha–Quartz* IEEE, Aug. 1962, 1812–1822.

Primary Examiner—Nguyen Vo
Attorney, Agent, or Firm—Gregg Rasor

[57] ABSTRACT

An automatic frequency control is implemented in a selective call receiver (100) having a controllable frequency synthesizer (203). The output frequency of the synthesizer an is derived from a frequency reference element (205). A temperature sensor (206) with substantial thermal coupling to the frequency reference element (205) produces a temperature signal representative of an operating temperature associated with the frequency reference element. The temperature signal is coupled to a controller (105) that operates to execute a microcode program implementing the automatic frequency control. Responsive to the temperature signal and at least one set of parameters representing a predetermined temperature versus frequency characteristic of the frequency reference element, a correction factor is generated and programmed in the frequency synthesizer (203). The correction factor corrects the output frequency to reflect a frequency error of substantially zero parts per million with respect to a desired operating frequency.

20 Claims, 7 Drawing Sheets

FREQUENCY SYNTHESIZER CORRECTION USING A TEMPERATURE RESPONSIVE DIVISOR CONTROL

This is a continuation of application Ser. No. 087, 246filed Jul. 7, 1993 and now abandoned.

FIELD OF THE INVENTION

This invention relates in general to the field of communication receivers, and more particularly to those communication receivers capable of actively compensating components of the receiver with respect to temperature variations, thus permitting consistent operation over a wide temperature range.

BACKGROUND OF THE INVENTION

Figure 1:
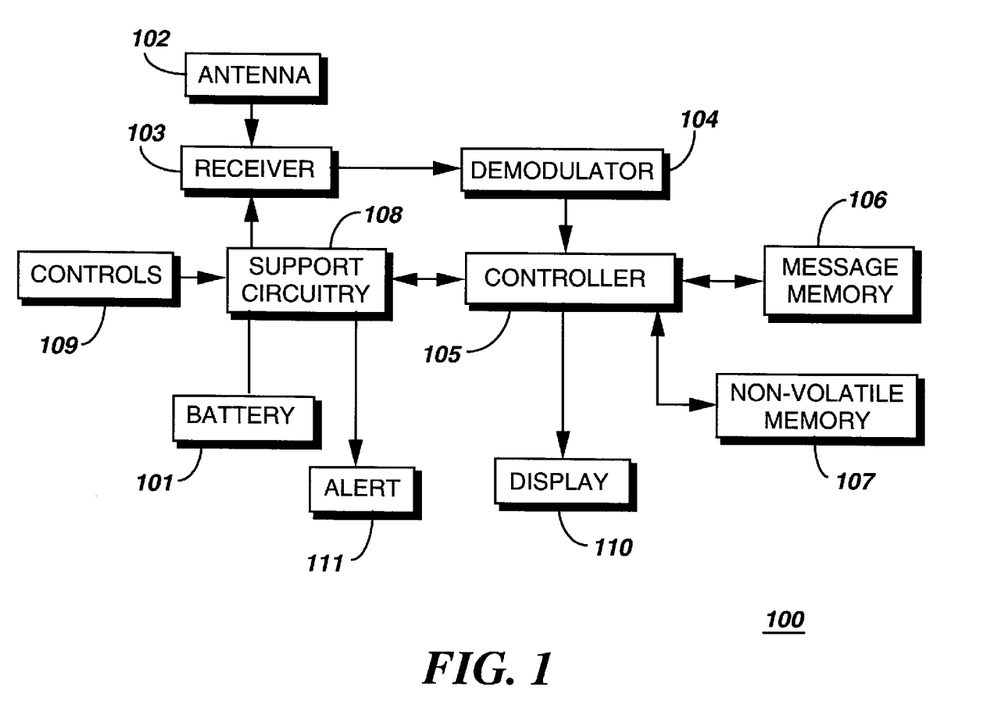
FIG. 1 is a block diagram of a selective call receiver suitable for use with the present invention.

A block diagram of a selective call receiver is shown in FIG. 1, the operation and components of which are well known to those skilled in the art. This figure is referenced for delineating some of the obstacles that need to be addressed in a system operating in the VHF or UHF frequency range. Typically, the bandwidth of the crystal filter and intermediate frequency (IF) filter(s) is a small fraction of the frequency of the received signal. Therefore, to maintain proper operation, the requirements of the local oscillator used for conversion are extreme in terms of temperature coefficient and frequency stability. For example, if the bandwidth of the IF filter is 12 kHz, and the one-sided signal deviation is 5 kHz, then it is desirable to keep the frequency drift to less than plus-or-minus 2 kHz to prevent the signal from drifting out of the IF passband. For example, when the first injection signal is 855 MHz the signal must be held constant within a plus-or-minus 2 kHz, which results in approximately plus-or-minus 2.5 parts per million (ppm) crystal stability. To further elaborate or the practical difficulties, consider that the local oscillator frequency reference element is typically a third or fifth overtone AT cut crystal blank having a resonant frequency of 45 MHz or 50.625 MHz, and that the injection signal is generated by multiplying the frequency reference element by 18 or 16 respectively. This yields an approximate worst case tolerance at the frequency reference element of plus-or-minus 100 hertz out of 45 million hertz!

As can be appreciated by one of ordinary skill in the art, while such high frequency crystals are obtainable, the prices are prohibitively high and require impractically complicated temperature compensation circuits to control the stability of the total oscillator circuit.

An alternative to using a high stability reference crystal is an Automatic Frequency Control (AFC) scheme. Conventional AFC schemes typically require a continuous wave (CW) signal to lock onto the carrier. Also, most closed loop AFC circuits utilize feedback control referenced to a master high stability signal source, and the feedback control must be carefully designed to achieve loop stability over the operating temperature range. Moreover, since conventional AFCs are coupled to the demodulator output, their operation is inherently non-linear over a typical operating temperature range. Thus, a special temperature compensation circuit is generally required to linearize the frequency correction signal derived from the demodulator and conditioned by the AFC circuit. This further sets a fundamental limit on the accuracy of an AFC of this type. Additionally, using an AFC in this way is expensive, especially in low cost electronic devices such as selective call receivers. As a result, an AFC system has not been a cost effective solution for selective call receivers.

Thus, what is needed is an economical AFC scheme that increases the frequency stability of a selective call receiver without the requiring an expensive, high stability, frequency reference element.

SUMMARY OF THE INVENTION

Briefly, according to the invention, there is provided a selective call receiver comprising: a controllable frequency synthesizer having an output frequency derived from a frequency reference element; a temperature sensor with substantial thermal coupling to the frequency reference element, the temperature sensor producing a temperature signal representative of an operating temperature associated with the frequency reference element, a controller coupled to the controllable frequency synthesizer and the temperature sensor, the controller operating to execute a microcode program implementing an automatic frequency control that generates a correction factor in response to the temperature signal and at least one set of parameters representing a predetermined temperature versus frequency characteristic of the frequency reference element, the correction factor serving to correct the output frequency of the controllable frequency synthesizer to reflect a frequency error of substantially zero parts per million with respect to a desired operating frequency.

DESCRIPTION OF A PREFERRED EMBODIMENT

Referring to FIG. 1, a battery 101 powered information display selective call receiver 100 operates to receive a signal via an antenna 102. A receiver 103 couples the received signal to a demodulator 104, which recovers any information signal present using conventional techniques. The recovered information signal is coupled to a controller 105 that interprets and decodes the recovered information. In the preferred embodiment, the controller 105 may comprise a microprocessor having a signal processor (decoder) implemented in both hardware and software.

The recovered information signal is checked by the decoder, which implements the signal processor that correlates a recovered address (i.e., a recovered information signal comprising address information) with a predetermined address stored in the selective call receiver's non-volatile memory 107. The non-volatile memory 107 typically includes a plurality of registers for storing a plurality of configuration words and other information that characterizes the operation of the selective call receiver 100. In determining the selection of the selective call receiver 100, a correlation is performed between a predetermined address associated with the selective call receiver 100 and a received and recovered address. When the addresses correlate, the controller 105 may couple a received and recovered message information to the message memory 106. In accordance with the recovered information, and settings associated with the user controls 109, the selective call receiver 100 typically presents at least a portion of the message information, such as by a display 110, and signals the user via an audible or tactile alert 111 that a message has been received. The user may view the information presented on the display 110 by activating the appropriate controls 109.

A support circuit 108 preferably comprises a conventional signal multiplexing integrated circuit, a voltage regulator and control mechanism, a current regulator and control mechanism, environmental sensing circuitry such as for light or temperature conditions, audio power amplifier circuitry, control interface circuitry, and display illumination circuitry. These elements are arranged in a known manner to provide the information display receiver 100 as requested by the customer.

Figure 2:
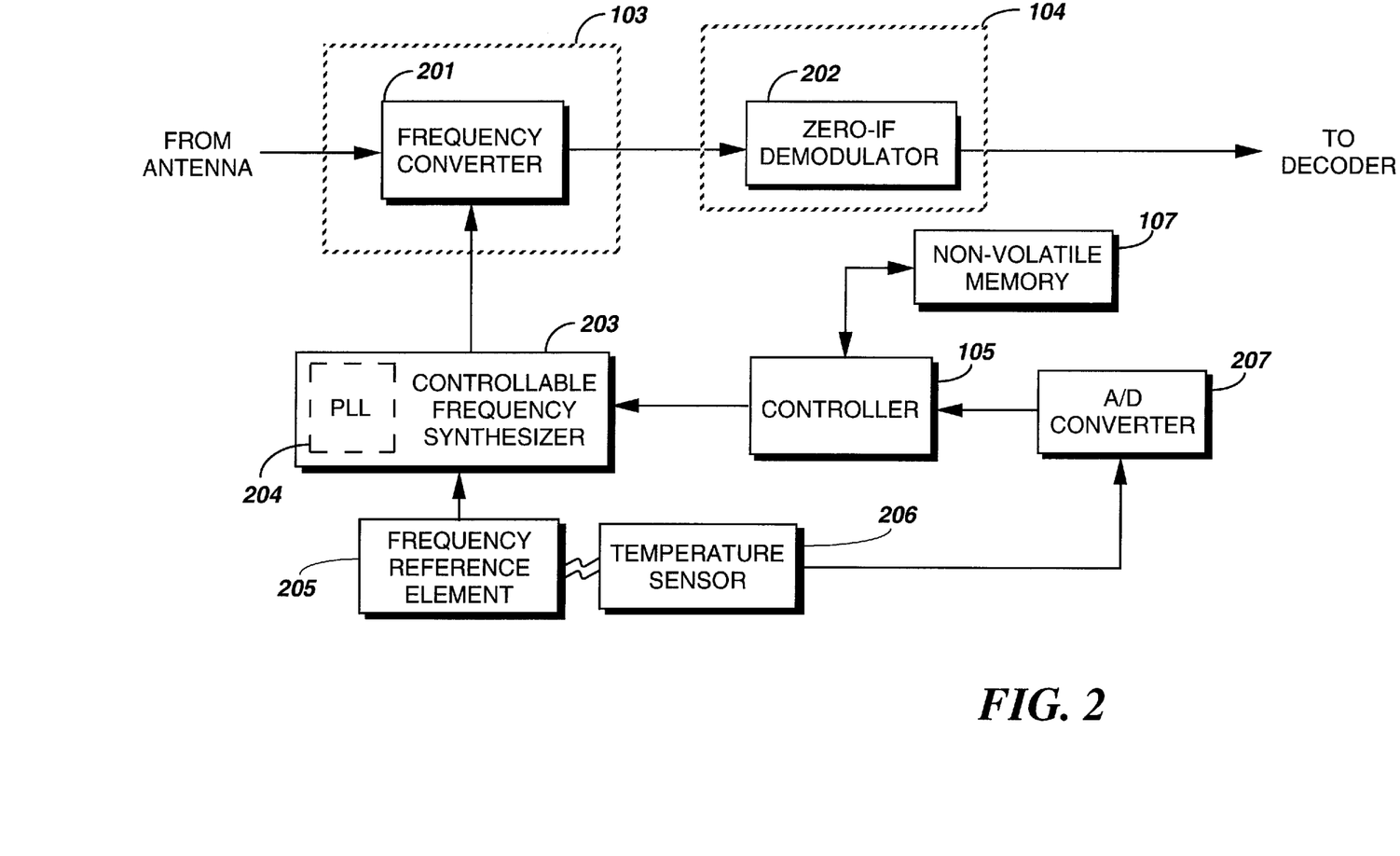
FIG. 2 is a partial block diagram of the selective call receiver depicted in FIG. 1 implementing a temperature compensated AFC in a zero-IF receiver in accordance with a first embodiment of the invention.

Referring to FIG. 2, the partial block diagram illustrates a temperature compensated AFC in a zero-IF receiver implemented in the selective call receiver depicted in FIG. 1, in accordance with a first embodiment of the invention.

A received signal that may include a modulated carrier signal is converted down to baseband using a conventional frequency converter 201. The resulting baseband signal is then demodulated using a conventional zero-if demodulator 202 such as a differentiate and cross-multiply topology or the like. The conversion is accomplished by mixing the received signal with a local oscillator signal provided by a controllable frequency synthesizer (i.e., a controllable signal source) 203. In the preferred embodiment, the controllable frequency synthesizer 203 comprises a programmable phase-locked loop synthesizer 204, optionally using a fractional N division scheme or the like such that the local oscillator signal frequency may be stepped in coarse or fine increments.

The controllable frequency synthesizer 203 is responsive to a controller module (e.g., an MC68HC05C4 manufactured by Motorola, Inc.) 105, that performs a sequence of decisions and controlling actions, as will be subsequently more fully discussed. The controller module 105 adjusts the local oscillator signal frequency by writing a control word (i.e., a divide factor) into the controllable frequency synthesizer 203, thereby programming the phase-locked loop 204 to a target frequency. The control word is derived from a set of parameters representing the temperature versus frequency characteristic of the frequency reference element 205. The parameters are stored in the non-volatile memory 107 that is accessed by the controller 105. To correct the output frequency of the controllable frequency synthesizer, an analog-to-digital (A/D) converter 207 samples a voltage or current coupled from a temperature sensor 206, the voltage or current serving to represent the ambient temperature of the frequency reference element 205. The voltage or current is coupled from a temperature sensor 206, and converted to a representation of absolute temperature by the controller 105. The controller then calculates the natural in-circuit resonant frequency error of the frequency reference element 205, and determines a correction factor C(T) from which a new divider ratio or the like is determined. The controller 105 then generates the control word and programs the new divider ratio in the controllable frequency synthesizer 203, resulting in a corrected output frequency of the controllable frequency synthesizer substantially coinciding with carrier frequency of the desired information signal.

Therefore, by closely coupling the temperature sensor 206 to the frequency reference element 205 (as indicated by the wavy lines) and monitoring the temperature of the frequency reference element 205, the controller 105 may execute a sequence of decisions and adjust the output frequency of the controllable frequency synthesizer 203 to achieve substantially zero parts per million (PPM) error relative to the desired carrier frequency. This operation allows a designer to choose a low-cost frequency reference element and through the application of active correction, achieve an output frequency stability equivalent to a frequency reference element that may be three or more times as expensive. This performance advantage is not limited to low-cost frequency reference elements, but is especially significant as a competitive advantage relating to increasing an ever shrinking profit margin seen in today's state of the art radio receivers.

Figure 3:
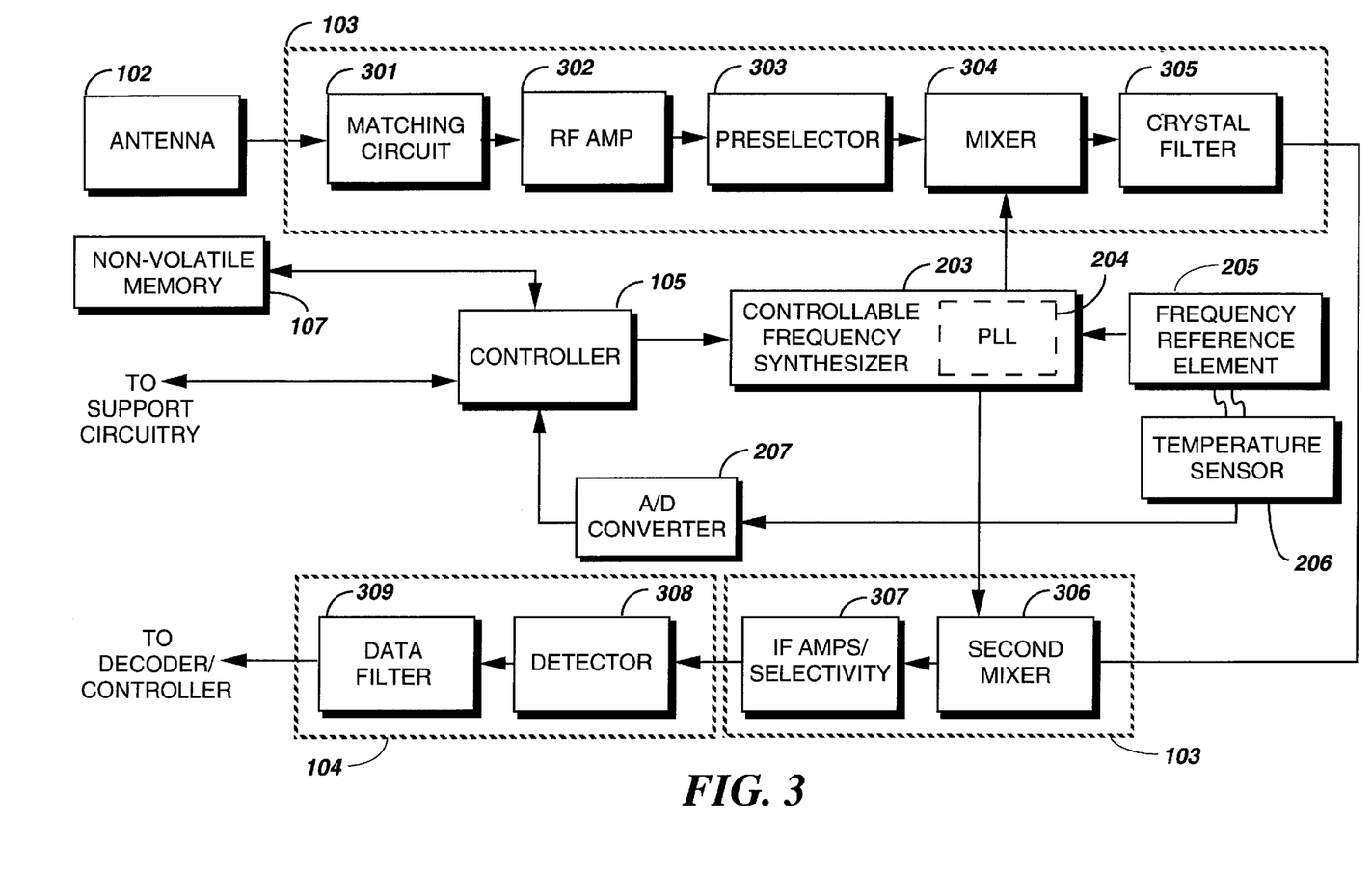
FIG. 3 partial block diagram of the selective call receiver depicted in FIG. 1 implementing a temperature compensated AFC in a dual conversion receiver in accordance with a second embodiment of the invention.

Referring to FIG. 3, the partial block diagram illustrates a temperature compensated AFC in a dual conversion receiver implemented in the selective call receiver depicted in FIG. 1, in accordance with a second embodiment of the invention.

The selective call receiver "RF front end" 301, 302, 303, 304, 305 is responsive to a transmitted signal that is received and coupled in via an antenna 102, as is commonly known in the art. The received signal from the antenna 102 may be optionally preconditioned using known techniques to provide an optimum signal level within a predetermined frequency bandwidth that is coupled to a first mixer 304.

The optional preconditioning of the received signal is usually performed by a matching circuit 301, a radio frequency amplifier 302, and a preselector filtering circuit 303, the design and function of these circuits being generally well known in the art. The matching circuit 301 matches the antennae 102 impedance characteristics to the RF amplifier 302. Preferably, the matching circuit is designed to provide the RF amplifier 302 with an optimum noise match (minimum noise figure) and low insertion loss, thereby optimally delivering the received signal power from the antenna 102 to the RF amplifier 302. The amplified signal is then be coupled to a preselector filtering circuit 303 that accepts a desired signal with minimal attenuation (e.g., within a predetermined frequency band) and attenuates (i.e., rejects) all undesired signals. Consequently, the received signal is preconditioned and coupled to the first signal mixer 304.

The first mixer 304 subsequently mixes the preconditioned received signal with a first local oscillator injection signal provided by the controllable frequency synthesizer 203. The controllable frequency synthesizer has an output frequency derived from the frequency reference element 205. The resulting conversion generates a first intermediate frequency signal that is subsequently coupled to a crystal filter 305 that passes the first intermediate frequency signal and attenuates any undesired signals such as the first mixer image signal and the first local oscillator injection signal.

A second mixer 306 mixes the first intermediate frequency signal with a second local oscillator injection signal provided by the controllable frequency synthesizer 203. The resulting second intermediate frequency signal is typically filtered and amplified (i.e., by an intermediate frequency amplifying and filtering circuit 307) and coupled to the demodulator 104. The demodulator in this embodiment comprises a modulation detector 308 that recovers information (i.e., FSK digital data, audio tones, PSK digital data, SSB, etc.) that is coupled to a decoder via a data filter 309 in a manner well known in the art.

Contemporaneously, the A/D converter 207 may sample the temperature of the frequency reference element 205, and provide digitally encoded representations of its temperature to the controller 105 as discussed earlier. The temperature sensor preferably has substantial thermal coupling to the frequency reference element (as shown with the wavy lines extending to the frequency reference element), as the temperature sensor should produce a temperature signal representative of the operating temperature associated with the frequency reference element.

In performing frequency correction, the controller 105 is coupled to the controllable frequency synthesizer 203 and the temperature sensor 206. The controller operates to execute a microcode program implementing an automatic frequency control. The result of the microcode program is a correction factor responsive to the temperature signal (from the sensor 206) and at least one set of parameters representing the predetermined temperature versus frequency characteristic of the frequency reference element 205. The correction factor serves to correct the output frequency of the controllable frequency synthesizer 203 to reflect a frequency error of substantially zero parts per million with respect to a desired operating frequency (e.g., the local oscillator frequency, clock frequency, or the like).

The non-volatile ram (e.g., read only memory, backed-up random access memory, EEPROM, or the like) 107 may provide storage for executable controller instructions, storage for intermediate temperature sampling and correction factor C(T) results, storage for past temperature sampling and correction factor C(T) results (used to eliminate re-calculating the correction factor C(T) and storage for non-volatile configuration information that may be necessary to perform the decisions and actions in the control process, as will be subsequently more fully discussed.

Figure 4:
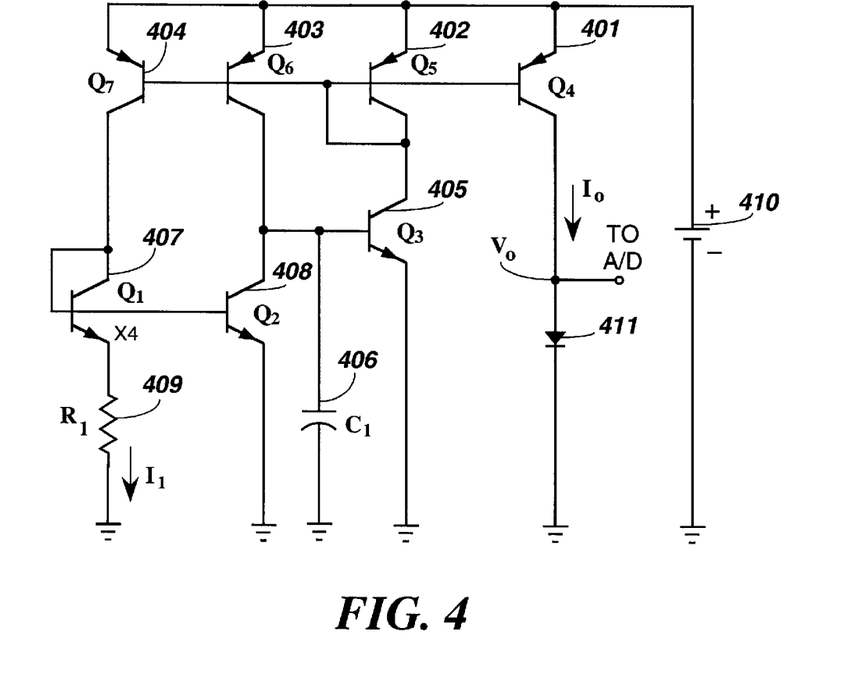
FIG. 4 is an exemplary implementation of a linear temperature sensor suitable for use with the present invention.

Referring to FIG. 4, the illustration shows an exemplary implementation of a linear temperature sensor suitable for use with the present invention.

The circuit shown uses a self-temperature compensating constant current source to provide a highly accurate reference current that biases a conventional semiconductor diode. Transistors $Q_4$ 401, $Q_5$ 402, $Q_6$ 403 and $Q_7$ 404 form a PNP current repeater with feedback stability compensation provided by $Q_3$ 405 and $C_1$ 406 for increased phase margin. Transistors $Q_1$ 407 and $Q_2$ 408 form a conventional current mirror. The current mirrored by $Q_1$ 407 is set primarily by the ratio of the emitter areas of $Q_1$ 407 and $Q_2$ 408 and the value of resistor $R_1$ 409. For illustrative purposes, a reference current ($I_o$) of 10 μA was chosen and a battery 410 voltage of 1.0 volts DC. The 10 μA reference current is repeated through $Q_4$ 401 into $D_1$ 411 The circuit illustrated in FIG. 4 is small enough that it may be integrated directly into the frequency reference element's package, thus yielding optimal thermal coupling between the reference element and the temperature sensor. Note that only the diode $D_1$ 411 needs to be closely coupled to the frequency reference element 205 since the measurement is made with reference to the diode $D_1$ 411 forward voltage characteristic ($V_o$) versus temperature. Alternatively, other forms of temperature sensing may be used such as dissimilar metal thermocouples, crystal lattice stress bridges, or resistors (thick film, thin film, IC process such as polysilicon or the like). One of ordinary skill in the art will appreciate that the alternatives for measuring temperature are practically limitless, and accordingly, can be incorporated within the contemplated scope of this invention.

The self-temperature compensating constant current source can be characterized as follows:

$$R_1(T)=3563\cdot[1+TC_1(T-T_{ref})] \quad [1]$$

where:

$$T_{ref}=298.15°K \quad [2]$$

$$T=T_{ref}, \quad [3]$$

and $$TC_1=3300\cdot10^{-6} \quad [4]$$

giving $R_1$ as a function of an intrinsic bulk resistance (the 3563 term), a first order temperature coefficient $TC_1$, the reference temperature $T_{ref}$, and the absolute temperature T. The specific constants are defined as:

$$k=1.381\cdot10^{-23} \quad [5]$$

$$q=1.602\cdot10^{-19} \quad [6]$$

and the emitter areas are:

$$A_{Q1}=4 \quad [7]$$

$$A_{Q2}=1 \quad [8]$$

yielding an emitter ratio constant of:

$$K_1 = \frac{A_{Q_1}}{A_{Q_2}} \quad [9]$$

Figures 5, 6:
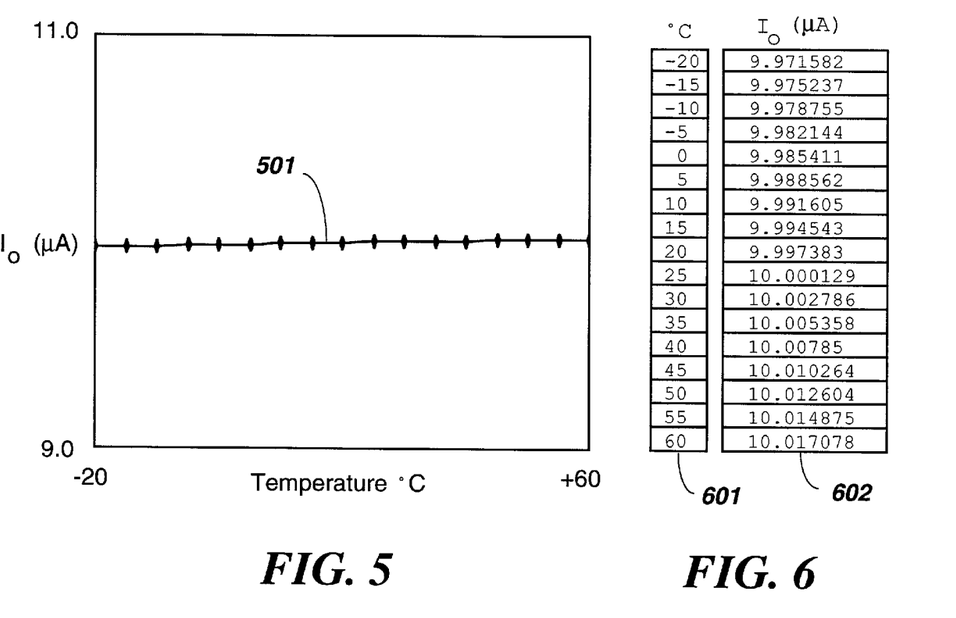
FIG. 5 is a graph illustrating the temperature versus current characteristic exhibited by the constant current reference (diamonds) in the linear temperature sensor of FIG. 4.
FIG. 6 is a table of the actual temperature-current operating points used in plotting the graph in FIG. 5.

Referring to FIG. 5, the graph illustrates the temperature versus current characteristic 501 exhibited by the constant current reference (diamonds) in the linear temperature sensor of FIG. 4. By inspection, one of ordinary skill in the art can see that the output current varies by less than one-half percent over the operating temperature range of −20° to +60° C.

Referring to FIG. 6, the table contains the actual temperature-current operating points used in plotting the graph in FIG. 5. The left column lists the temperature points in degrees Celsius 601 and the right column lists the corresponding output current $I_o$ in μA 602. The current output operating characteristic can be approximated by the equation:

$$I_0(T) \frac{kT \ln(K_1)}{q R_1(T)} \cdot 10^6 \text{ in } \mu A \qquad [10]$$

Figures 7, 8:
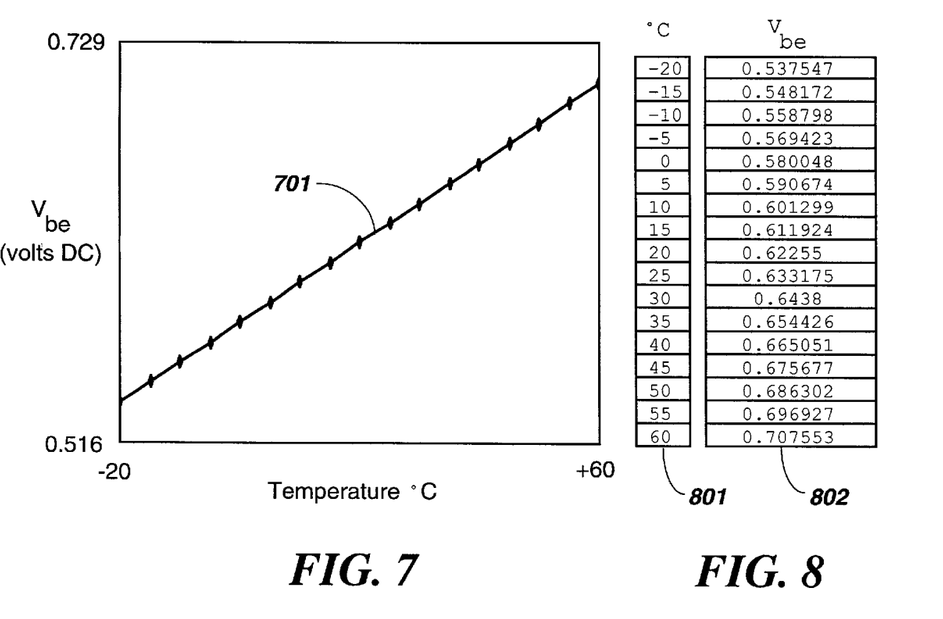
FIG. 7 is a graph illustrating the temperature versus voltage characteristic exhibited at the voltage sampling element (diamonds) in the linear temperature sensor of FIG. 4.
FIG. 8 is a table of the actual temperature-voltage operating points used in plotting the graph in FIG. 7.

Referring to FIG. 7, the graph illustrates the temperature versus voltage characteristic 701 exhibited at the voltage sampling element (discrete points indicated by diamonds) in the linear temperature sensor of FIG. 4. Again, by inspection, one of ordinary skill in the art can see that the linearity of the output voltage varies by less than one-half percent over the operating temperature range of −20° to +60° C.

Referring to FIG. 8, the table contains the actual temperature-voltage operating points used in plotting the graph in FIG. 7. The left column lists the temperature points in degrees Celsius 801 and the right column lists the corresponding output voltage $I_o$ in DC volts 802. The voltage output operating characteristic can be approximated by the equation:

$$V_{be}(T) = \left[\frac{kT}{q}\right] \ln\left[\frac{I_0(T)10^6}{I_s}\right] \qquad [11]$$

Figure 9:
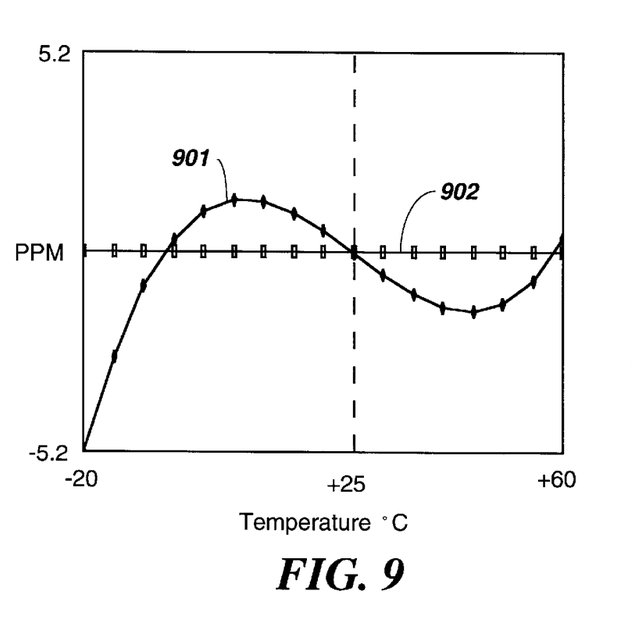
FIG. 9 is a graph illustrating the overlaid temperature versus frequency error (in parts per million or PPM) characteristics exhibited by the uncompensated frequency reference element (diamonds) and the controllable frequency synthesizer after correction (rectangles) in accordance with the preferred embodiment of the invention.

Referring to FIG. 9, the graph illustrates the overlaid temperature versus frequency error (in parts per million or PPM) characteristics exhibited by the uncompensated frequency reference element (discrete points indicated by diamonds) 901 and the controllable frequency synthesizer after correction (discrete points indicated by rectangles) 902 in accordance with the preferred embodiment of the invention. Note that the uncompensated frequency reference element exhibits a characteristic indicative of a third order polynomial, such as is expected from an AT cut quartz resonator. The procedure described herein is not limited to the correction of third order systems, but may be applied to resonator systems with linear, parabolic, or parametric non-linear temperature-frequency characteristics, with all yielding equally beneficial correction results.

Figure 10:
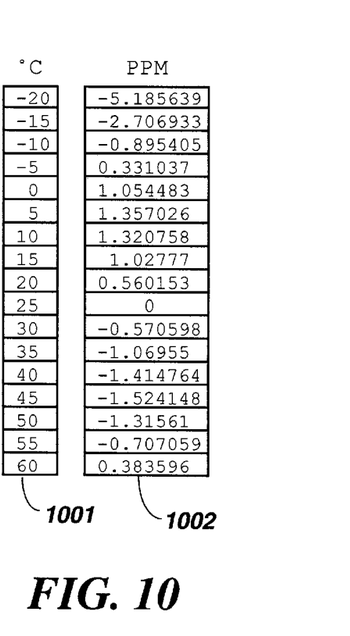
FIG. 10 is a table of the actual temperature-PPM operating points used in generating the correction factor C(T) and in plotting the characteristics shown in FIG. 9.

Referring to FIG. 10, the table contains the actual temperature-PPM operating points used in generating the correction factor C(T) and in plotting the characteristics shown in FIG. 9. The left column lists the temperature points in degrees Celsius 1001. The right column lists the corresponding measured data in part per million frequency error (PPM) 1002.

Figure 11:
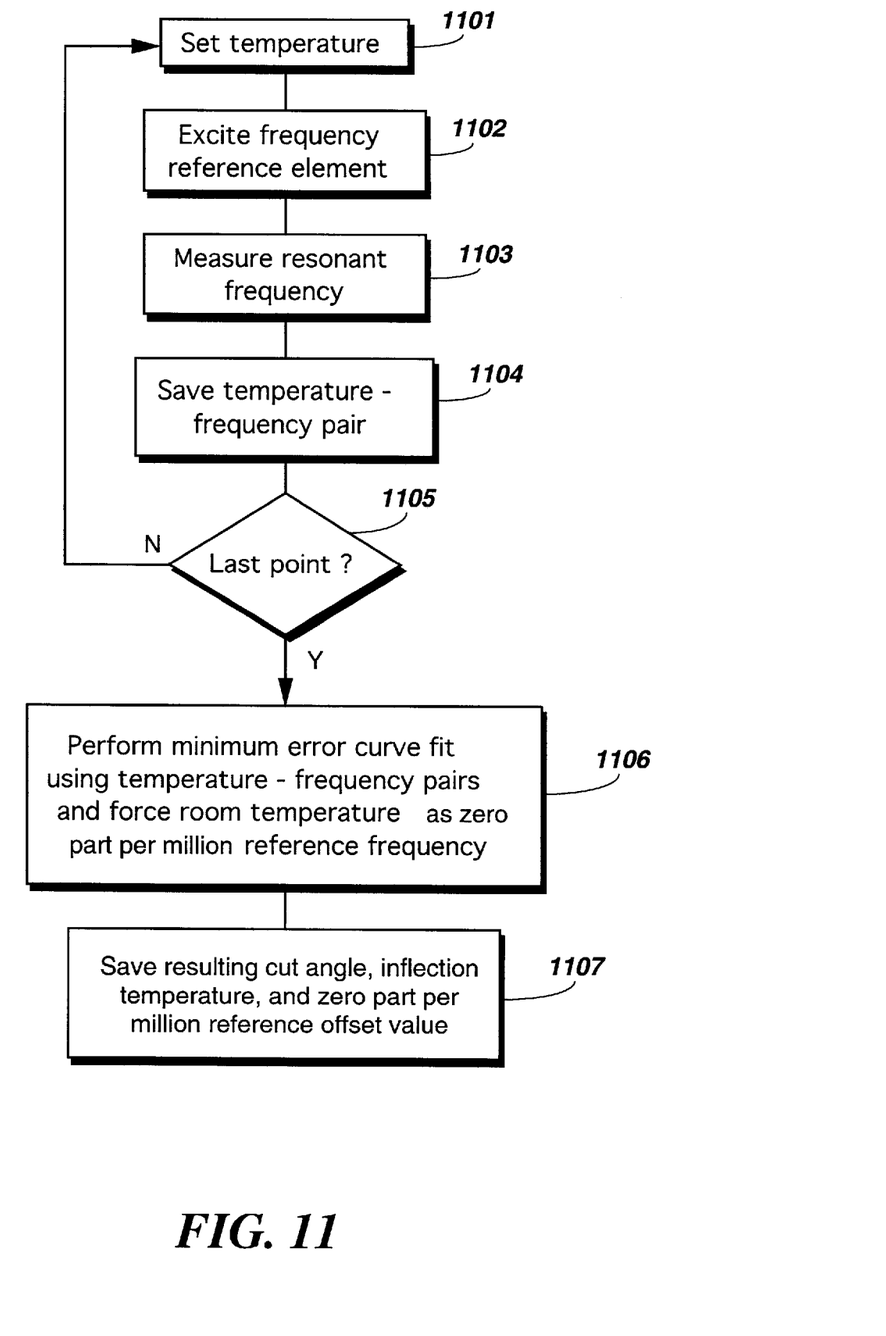
FIG. 11 is a flow diagram illustrating the characterization of the uncompensated frequency reference element in accordance with the present invention.

Referring to FIG. 11, the flow diagram illustrates the characterization of the uncompensated frequency reference element in accordance with the present invention.

For the third order characteristic illustrated in FIG. 9, the correction factor C(T) is calculated using the following procedure:

First, determine the lattice constants for the cut model (in this case an AT cut quartz resonator):

$$A_1 = 8.583 \cdot 10^{-2} \qquad [12]$$

$$B_1 = 3.9 \cdot 10^{-4} \qquad [13]$$

$$B_2 = 7.833 \cdot 10^{-5} \qquad [14]$$

$$C_1 = 1.095 \cdot 10^{-4} \qquad [15]$$

$$C_2 = 3.3 \cdot 10^{-8} \qquad [16]$$

Second, select a reference temperature:

$$T_{reference} = 25.0°C. \qquad [17]$$

Third, measure the frequency of the frequency reference element 205 over temperature 1101 with the frequency reference element 205 terminated in either the actual operating circuit or a like simulation. The frequency reference element 205 must be excited by an external frequency source 1102 to determine its resonant point. After collecting 1103 a series of temperature-frequency data pairs 1104, 1105, perform a minimum error curve fit 1106 while forcing room temperature (connotated here as $T_{reference}$, which may be arbitrarily selected) as the zero part per million reference frequency. The minimum error should be calculated as an equally weighted average over the entire characteristic within the desired operating temperature range. The minimum error curve fit preferably allows the inflection temperature, $T_{inflection}$, to "float" while iterating the cut angle $\Phi$ for a relative minimum in the error function, then fixing the cut angle $\Phi$ while iterating the inflection temperature for a relative minimum in the error function. This procedure is repeated until little or no improvement results in the error function. For the AT cut crystal characteristic plotted in FIG. 9, the following parametric equations define the third order characteristic:

$$A(\Phi) = -\Phi A_1 \qquad [18]$$

$$B(\Phi) = B_1 - \Phi B_2 \qquad [19]$$

$$C(\Phi) = C_1 - \Phi C_2 \qquad [20]$$

$$\Delta T(T) = T - T_{inflection} \qquad [21]$$

$$PPM(T) = A(\Phi)\Delta T(T) + B(\Phi)\Delta T(T) + C(\Phi)\Delta T(T)^3 \qquad [22]$$

Equation [22] defines the idealized frequency error of an AT cut crystal resonator. The result of this equation or of any characteristic equation corresponding with a particular resonator characteristic is compared to the measured temperature-frequency pairs to derive the error function. In the preferred embodiment of the present invention, the error function is calculated using the square root of the arithmetic average of the sum of the squared error terms. This yields is pseudo root mean square figure of merit that suits most all resonator characteristics. Using measured data, the discrete points shown in FIG. 10's table were plotted in FIG. 9 as diamonds. The simulated frequency reference element 205 characteristic is overlaid as a solid line through the diamonds. Note that the measured and simulated data correspond almost exactly, yielding a curve fit confidence of greater than 0.99 (1.00 is perfect). Accordingly, the results of the curve fit are as follows:

$$\Phi = 1.34799159 \qquad [23]$$

$$T_{inflection} = 26.50232506° C. \qquad [24]$$

$$PPMR = 0.17408697 \qquad [25]$$

where PPMR represents the absolute offset necessary to "shift" the response characteristic and achieve a zero PPM reference at the reference temperature 1107. From the resulting three curve parameters given in [23], [24], and [25], one can accurately predict the frequency error given any temperature, or as is the case in the instant invention, using any measured temperature within the operating range of the frequency reference element. The following equation yields P(T) which represents the absolute part per million error as a function of temperature and the other variables previously discussed:

$$P(T) = PPM(T) - PPMR \qquad [26]$$

Lastly, the correction factor C(T) is calculated as follows:

$$C(T) = -P(T) \quad [27]$$

Figure 12:
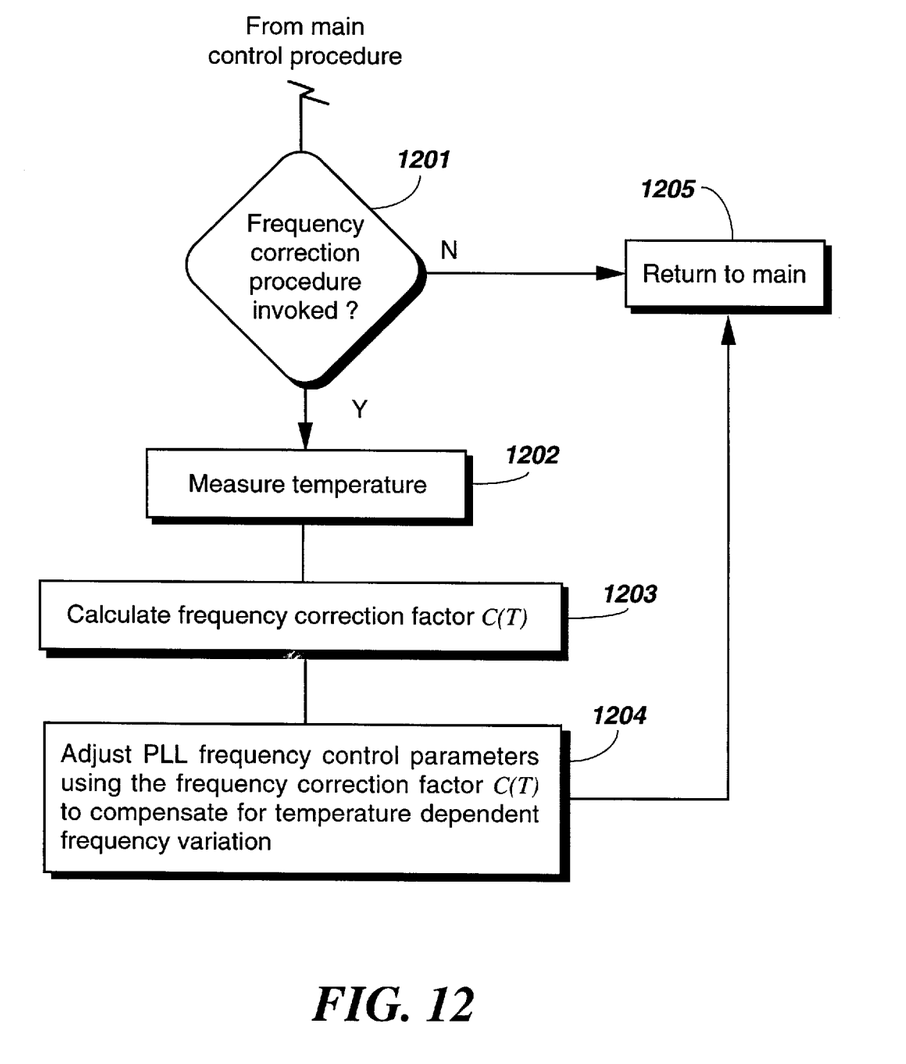
FIG. 12 is a flow diagram illustrating the application of the correction factor C(T) to correct the output frequency of the controllable frequency synthesizer in accordance with the present invention.

Referring to FIG. 12, the flow diagram illustrates the application of the correction factor C(T) to correct the output frequency of the controllable frequency synthesizer 203 in accordance with the present invention.

Step 1201 tests to see if the frequency correction procedure has been invoked. If true, the processor measures the temperature of the frequency reference element 1202, calculates the correction factor C(T) 1203, and adjusts the output frequency of the controllable frequency synthesizer 203 by altering the programmable divide factor in the PLL frequency synthesizer 1204. When complete, the procedure returns control to the main control program 1205.

In summary, this invention allows the use of a lower cost, high tolerance frequency reference element in a receiver using a controlled frequency synthesizer. With this invention, the designer can select a 5, 10, or possibly 15 PPM crystal that may be digitally (via a programmable PLL) corrected to fall within a 2 PPM window as required for use with an 800 to 900 MHz receiver.

The frequency reference element 205 (e.g., an AT, BT, or other cut crystal) is characterized per the procedure disclosed herein. The tests performed include measuring the resonant frequency in the appropriate impedance at temperatures within the specified operating temperature range.

The resulting data pairs (temperature-frequency) are run through a computer program that generates a set of curve fit parameters representing the reference element's temperature versus frequency characteristic. In the case of the exemplary AT cut quartz crystal, the parameters are Φ, the angle of cut in minutes relative to a zero degree AT cut, the inflection temperature $T_{inflection}$, and PPMR, the parts per million reference offset value to correct the reference element to zero PPM at the reference temperature (usually 25° C.). Using these three parameters, a mathematical relation is derived that is a function of the type of cut used to manufacture the frequency reference element (e.g., AT, BT, etc.), and the temperature in ° C. For third order AT cut quartz resonators, this relation is known as the Bechmann equation. In a practical application, the Bechmann equation is capable of predicting the temperature versus frequency characteristic of a quartz resonator within 0.5 PPM PMS from −30° to +70° C. using the procedure disclosed herein. Note that the procedure disclosed is also applicable to ceramic resonators as they exhibit nonlinear temperature versus frequency characteristics.

Once Φ, the inflection temperature $T_{inflection}$, and PPMR are known, they are programmed into a PROM, EEPROM, or the like within the receiver. The controller can then access the parameters to solve for the correction factor C(T) that is applied to adjust the local oscillator for zero PPM performance. The system utilizes a temperature reference that can be read by the controller for generating a value corresponding to the temperature variable in the Bechmann equation. One way of accomplishing this is to use a known TC current source to bias a diode that is closely coupled to the reference element. Since the diode has a stable voltage versus temperature characteristic, a linear relationship can be established between the diode's voltage at a reference current and the absolute temperature of the diode's junction. This voltage can be read by an A/D converter of a predetermined precision and converted directly to a temperature in ° C. This temperature is then used by the microcontroller to adjust the output frequency of the frequency synthesizer.

The disclosed invention is particularly useful when used in conjunction with a fractional-N frequency synthesizer because the fractional-N topology can make frequency adjustments in either a fine or coarse mode.

What is claimed is:

1. A frequency synthesizer having a temperature stabilized output frequency, the frequency synthesizer comprising:

a frequency reference element that produces a reference frequency;

a temperature sensor with substantial thermal coupling to the frequency reference element, the temperature sensor producing a temperature signal representative of an operating temperature associated with the frequency reference element; and a controller coupled to the temperature sensor, the controller operating to execute a microcode program implementing an automatic frequency control that calculates a correction factor from an equation having at least one coefficient representing a previously measured temperature versus frequency characteristic of the frequency reference element, calculation of the correction factor being effected and having a range determined by a representation of the temperature signal as an independent variable, the correction factor serving to alter a divide factor that is programmed in a divider inside a closed frequency control loop in the frequency synthesizer, the divider operating to select a desired operating frequency that will eliminate any frequency error as measured between the temperature stabilized output frequency of the frequency synthesizer and the desired operating frequency.

2. The frequency synthesizer according to claim 1 wherein the temperature signal is an analog temperature signal.

3. The frequency synthesizer according to claim 2 further comprising:

an analog to digital converter coupled to the temperature sensor; the analog to digital converter acting to sample and convert the analog temperature signal to a digital temperature signal.

4. The frequency synthesizer according to claim 1 further comprising:

a non-volatile memory coupled to the controller, the non-volatile memory storing the at least one set of parameters representing the predetermined temperature versus frequency characteristic of the frequency reference element.

5. The frequency synthesizer according to claim 1 wherein the correction factor is used by the controller to generate a control word representing the divide factor that is programmed into the divider inside the closed frequency control loop in the frequency synthesizer to correct the output frequency of the frequency synthesizer to substantially eliminate any frequency error with respect to the desired operating frequency.

6. The frequency synthesizer according to claim 1 wherein the frequency synthesizer is implemented using a fractional-N divider topology.

7. The frequency synthesizer according to claim 1 wherein the frequency synthesizer is implemented using a modulo-N divider topology.

8. The frequency synthesizer according to claim 1 wherein the frequency reference element is an AT cut quartz resonator.

9. The frequency synthesizer according to claim 1 wherein the frequency reference element is an BT cut quartz resonator.

10. The frequency synthesizer according to claim 1 wherein the frequency reference element is a ceramic resonator.

11. A selective call receiver comprising:
a frequency reference element that produces a reference frequency;
a frequency synthesizer having a temperature stabilized output frequency derived from the frequency reference element;
a temperature sensor with substantial thermal coupling to the frequency reference element, the temperature sensor producing a temperature signal representative of an operating temperature associated with the frequency reference element;
a receiver responsive to the output frequency of the frequency synthesizer, the receiver being capable of receiving an information signal to provide a received information signal;
a demodulator for recovering a serial bit stream from the received information signal, the serial bit stream comprising an address signal, and
a controller coupled to the frequency synthesizer, the temperature sensor, and the demodulator, the controller executing a microcode program that:
controls operation of the selective call receiver;
determines selection of the selective call receiver when the address signal substantially correlates with a predetermined address associated with the selective call receiver;
decodes at least one selective call message from the serial bit stream and store the at least one selective call message in a message memory; and
implements an automatic frequency control that generates a correction factor from an equation having at least one coefficient representing a previously measured temperature versus frequency characteristic of the frequency reference element, calculation of the correction factor being effected and having a range determined by a representation of the temperature signal as an independent variable, the correction factor serving to alter a divide factor that is programmed in a divider inside a closed frequency control loop in the frequency synthesizer, the divider operating to select a desired operating frequency that will eliminate any frequency error as measured between the temperature stabilized output frequency of the frequency synthesizer and the desired operating frequency.

12. The selective call receiver according to claim 11 wherein the temperature signal is an analog temperature signal.

13. The selective call receiver according to claim 12 further comprising:
an analog to digital converter coupled to the temperature sensor, the analog to digital converter acting to sample and convert the analog temperature signal to a digital temperature signal.

14. The selective call receiver according to claim 11 further comprising:
a non-volatile memory coupled to the controller, the non-volatile memory storing the at least one set of parameters representing the predetermined temperature versus frequency characteristic of the frequency reference element.

15. The selective call receiver according to claim 11 wherein the correction factor is used by the controller to generate a control word representing the divide factor that is programmed into the divider inside the closed frequency control loop in the frequency synthesizer to correct the output frequency of the frequency synthesizer to substantially eliminate any frequency error with respect to the desired operating frequency.

16. The selective call receiver according to claim 11 wherein the frequency synthesizer is implemented using a fractional-N divider topology.

17. The selective call receiver according to claim 11 wherein the frequency synthesizer is implemented using a modulo-N divider topology.

18. The selective call receiver according to claim 11 wherein the frequency reference element is an AT cut quartz resonator.

19. The selective call receiver according to claim 11 wherein the frequency reference element is an BT cut quartz resonator.

20. The selective call receiver according to claim 11 wherein the frequency reference element is a ceramic resonator.

* * * * *